(12) United States Patent
Baba

(10) Patent No.: US 7,642,456 B2
(45) Date of Patent: Jan. 5, 2010

(54) ELECTRICAL JUNCTION BOX TO BE MOUNTED ON MOTOR VEHICLE

(75) Inventor: Akira Baba, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/213,162

(22) Filed: Jun. 16, 2008

(65) Prior Publication Data

US 2009/0008122 A1 Jan. 8, 2009

(30) Foreign Application Priority Data

Jul. 5, 2007 (JP) ............................. 2007-177549

(51) Int. Cl.
*H02G 3/08* (2006.01)

(52) U.S. Cl. .................. 174/50; 174/17 R; 174/58; 174/64; 248/314; 361/630

(58) Field of Classification Search ............... 174/17 R, 174/50, 58, 59, 64, 520, 559, 57; 248/314, 248/309.1; 361/630, 822, 600; 220/4.02; 439/535

See application file for complete search history.

(56) References Cited

U.S. PATENT DOCUMENTS

| | | | |
|---|---|---|---|
| 5,971,337 A | | 10/1999 | Furuya |
| 6,822,163 B2 * | | 11/2004 | Saneto et al. .................. 174/59 |
| 6,919,509 B2 * | | 7/2005 | Oda .............................. 174/59 |
| 7,053,298 B2 * | | 5/2006 | Ikeda et al. .................... 174/50 |
| 7,432,441 B2 * | | 10/2008 | Liang ........................... 174/50 |
| 7,514,629 B2 * | | 4/2009 | Sasaki et al. .................. 174/50 |

FOREIGN PATENT DOCUMENTS

| | | |
|---|---|---|
| JP | U-05-31088 | 4/1993 |
| JP | A-2004-096949 | 3/2004 |

* cited by examiner

*Primary Examiner*—Dhiru R Patel
(74) *Attorney, Agent, or Firm*—Oliff & Berridge, PLC

(57) ABSTRACT

An electrical junction box for a motor vehicle is configured to prevent loss of a fuse that falls down during maintenance. Fuse-containing sections are provided on a vertical surface of a casing of an electrical junction box. The fuse-containing sections are opposed to a trim cover provided with an opening for maintenance in the motor vehicle. Fuse-receiving plates project toward the trim cover integrally on or detachably from the casing surface at the position below the fuse-containing sections. The fuse-receiving plate has a length in which a distal end contacts the trim cover or the distal end is spaced away from the trim cover by a clearance through which a fuse cannot pass. The fuse-receiving plates can receive a fuse that falls down during a fuse attachment or detachment operation.

6 Claims, 7 Drawing Sheets

[Fig. 1]
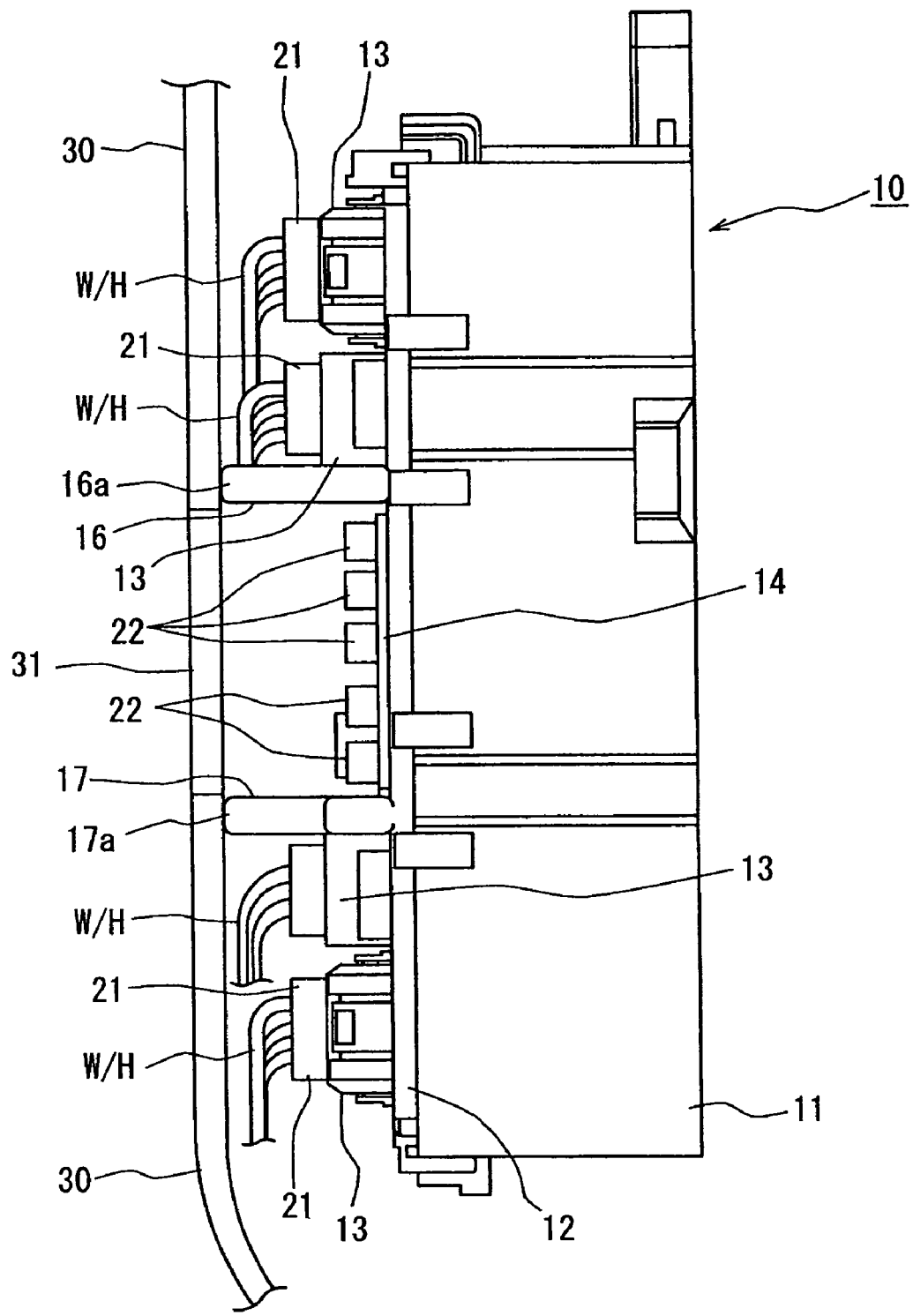

[Fig. 2]
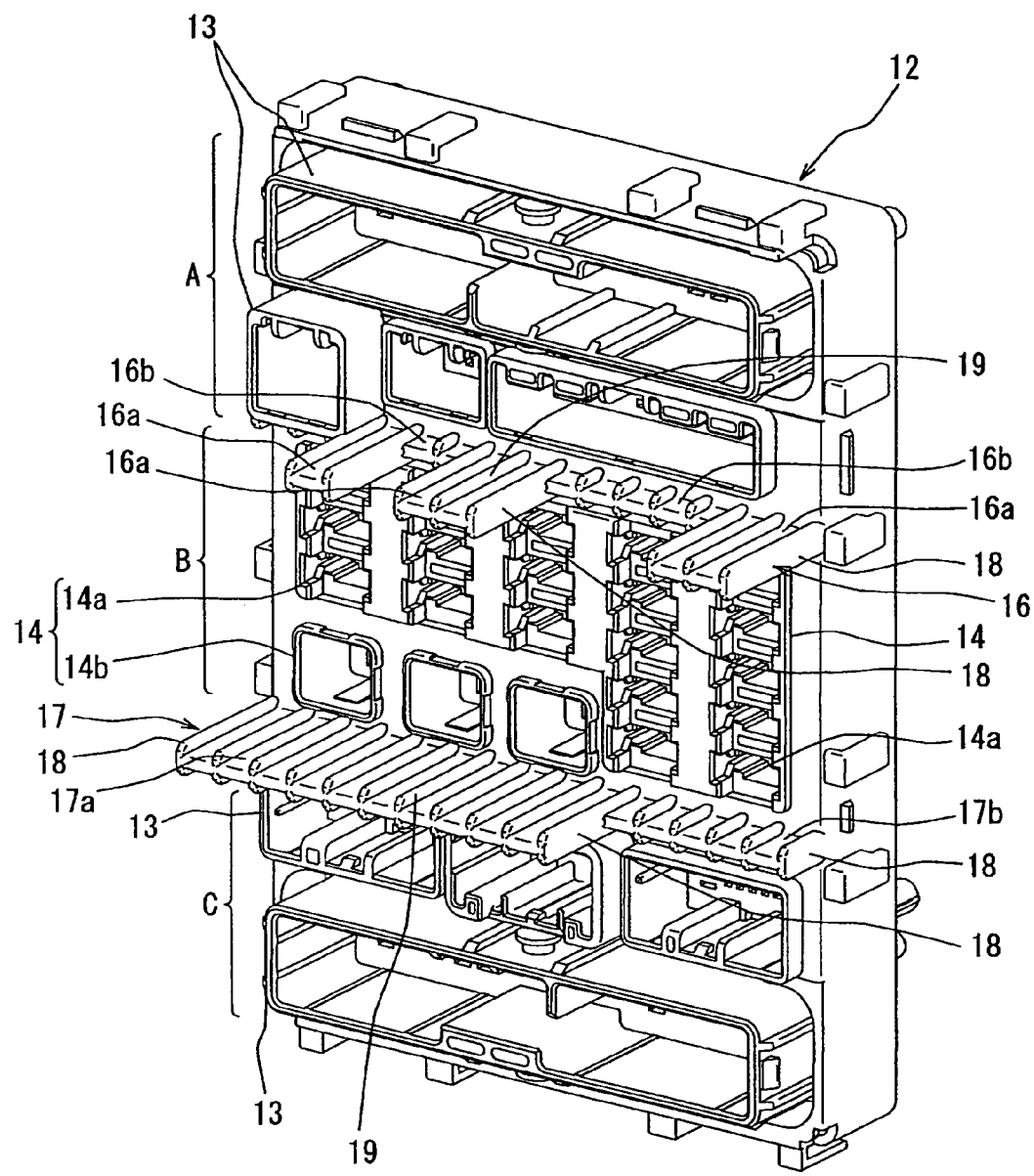

[Fig. 3]
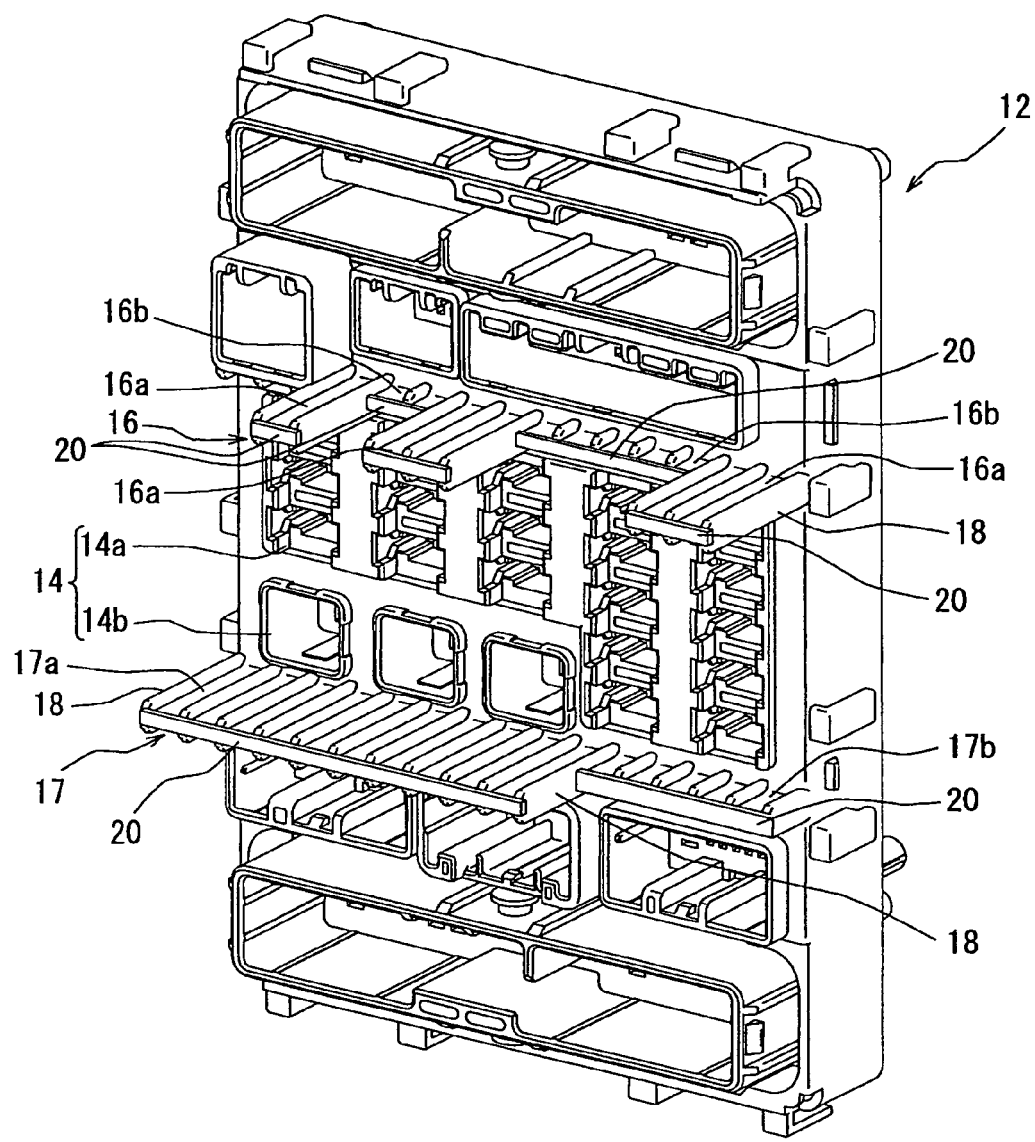

[Fig. 4]
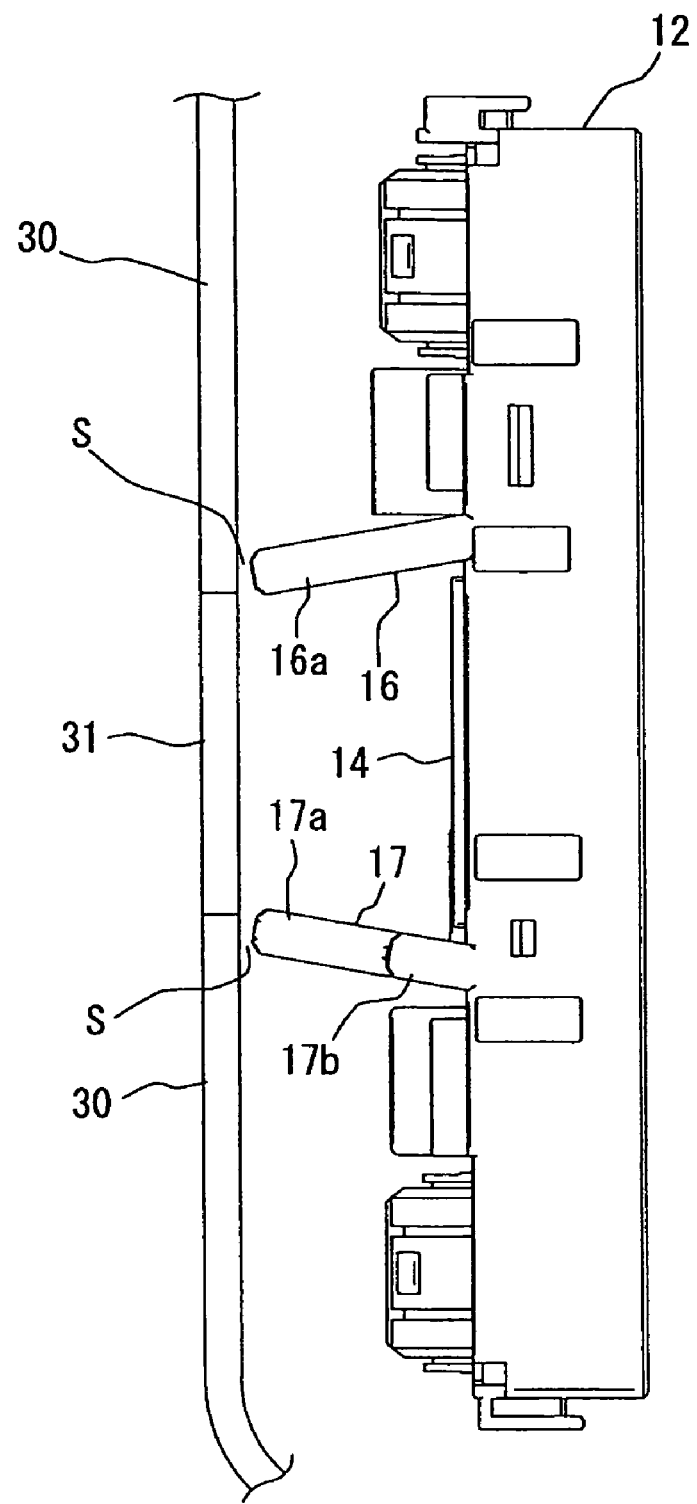

[Fig. 5]
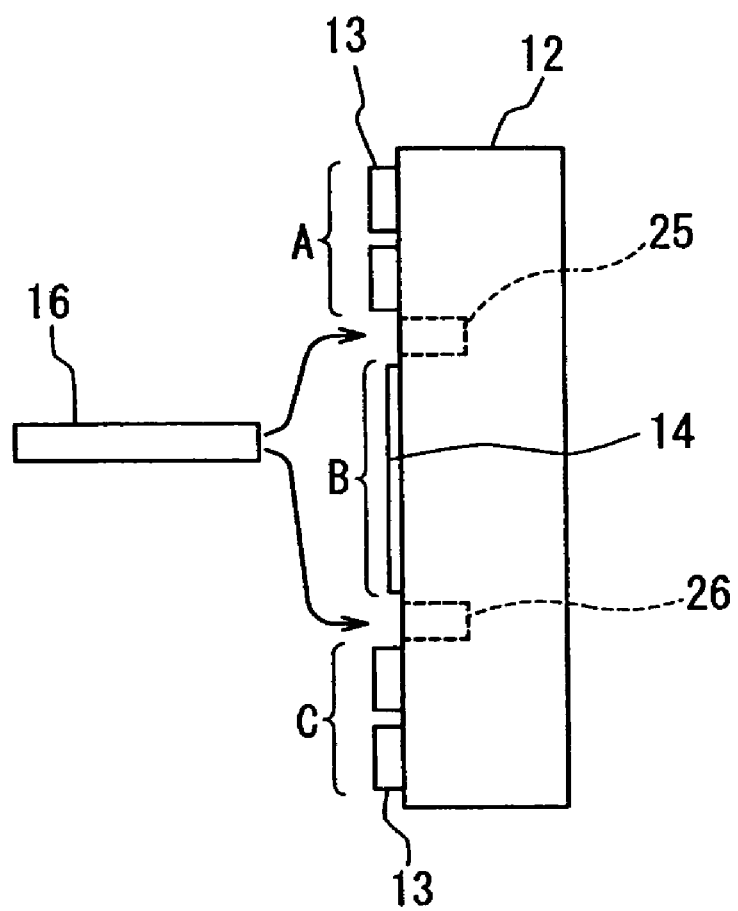

[Fig. 6]
(A)
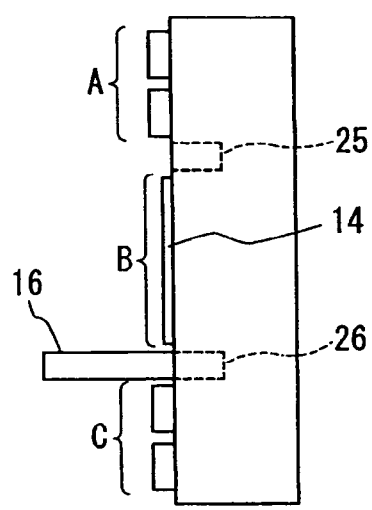
(B)
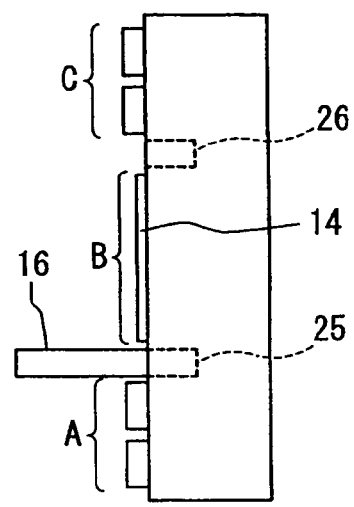

[Fig. 7]
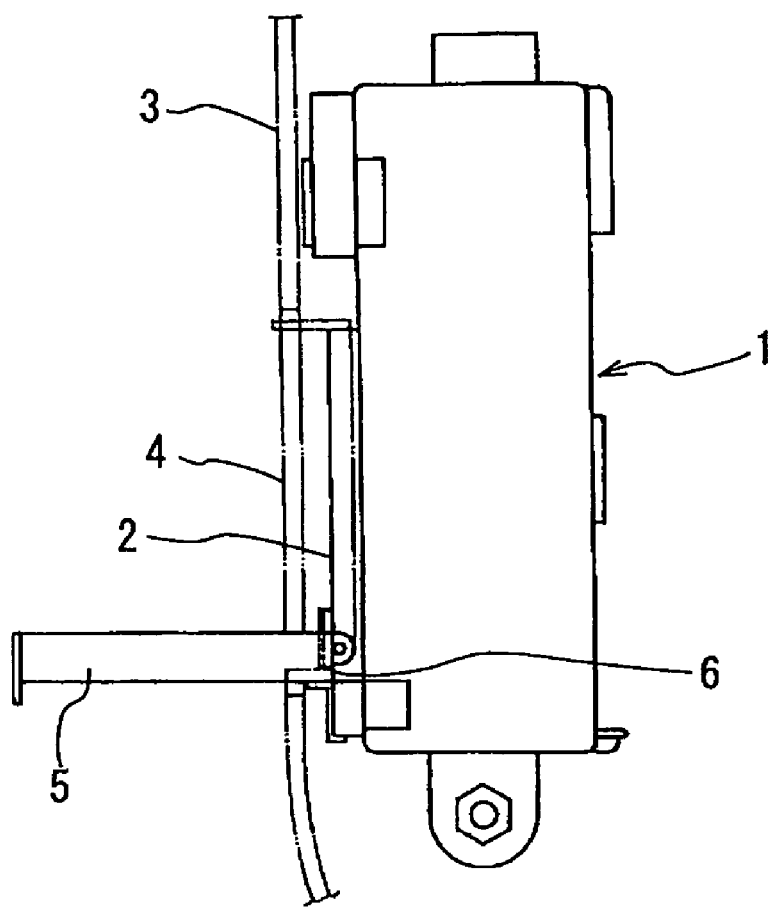

ELECTRICAL JUNCTION BOX TO BE MOUNTED ON MOTOR VEHICLE

This application claims benefit of Japanese Patent Application JP-A-2007-177549, filed Jul. 5, 2007, the disclosure of which is hereby incorporated by reference herein in its entirety.

BACKGROUND

This disclosure is directed to an electrical junction box having fuse-containing sections configured to prevent loss of a fuse when the fuse falls down during an exchange of the fuse.

In an electrical junction box that is mounted on a motor vehicle, when any fuse contained in the electrical junction box has blown, a fuse puller is inserted into an opening for maintenance provided in a panel of a motor vehicle, the fuse puller holds the blown fuse fixed in one of fuse-containing sections and takes out the blown fuse from the section. Then, the fuse puller holds a new fuse and inserts it into the fuse-containing section.

In exchanging the blown fuse with a new one, when the blown fuse is a minimized type of fuse, i.e. very small in size, it is difficult for the fuse puller to firmly hold the fuse. Consequently, there are situations where the fuse falls out of the fuse puller. If the fuse falls down in an area of a lower floor side of the motor vehicle closed by a panel, it will be difficult to retrieve the loose fuse. In this case, unusual noises are often caused by the fuse rolling on the floor when driving the motor vehicle.

In consideration of the above problem, Japanese Utility Model Disclosure HEI 5 (1993)-31088 (hereinafter "JP '088") discloses an electrical junction box 1 such as that shown in FIG. 7. The electrical junction box 1 includes a trim cover 3 with an opening 4, a fuse box 2 standing vertically inside the opening 4, a cover 5 that is rotatably supported on a lower part of the fuse box 2 and that covers fuses contained horizontally in the fuse box 2. The cover 5 is provided with a stopper 6 that serves to stop the fuse cover 5 on the fuse box 2. When the cover 5 is opened, the cover 5 extends outward from the opening 4 in the trim cover 3 and is supported horizontally on the fuse box 2.

In the configuration described above, since the electrical junction box is provided with the open/close fuse cover 5, the cover 5 can receive any fuse that falls down during maintenance, thereby preventing loss of the fuse.

In the electrical junction box 1 described above, it is necessary to form the opening 4 in the trim cover 3 so that the opening 4 is large enough for the fuse cover 5 to project therethrough. This requirement results in restricting design of the opening 4. On the other hand, if the size of the opening 4 is determined, the size of the cover 5 is restricted in connection with the opening 4. Furthermore, it is necessary to provide a mechanism for turning the cover 5 and a stopper mechanism for stopping the cover 5 in the electrical junction box 1. This leads to a complicated structure for the above-described electrical junction box.

Also, since a space where a fuse puller can work to remove the fuse is required, if the fuse-containing sections are arranged near a bearing at a lower part of the cover 5, the cover 5 will interfere with the fuse puller, thereby restricting the working space for the fuse puller. Also, the cover 5 must be supported at a lower part spaced apart from the fuse-containing sections in order to define the working space, leading to the opening 4 in the trim cover 3 being larger.

SUMMARY

In view of the above problems, an object of the disclosed embodiments is to provide an electrical junction box that eliminates a rotatable cover projecting toward the trim cover, as described above, and readily receives a fuse that may fall down during maintenance.

In order to solve the above problems, an electrical junction box to be mounted on a motor vehicle is provided in which fuse-containing sections are provided on a vertical surface of a casing when the casing is mounted on a motor vehicle. The fuse-containing sections are opposed to a trim cover provided with an opening for maintenance in the motor vehicle. Fuse-receiving plates project toward the trim cover integrally on, or detachably from, the casing surface at a position below the fuse-containing sections and/or between connector-containing sections. Each of the fuse-receiving plates may have a length such that a distal end contacts the trim cover. Alternatively, the distal end may be spaced away from the trim cover by a given clearance, the clearance being configured such that a fuse cannot pass therethrough. The fuse-receiving plates may be configured to receive a fuse that falls down during a fuse attachment or detachment operation into or from the fuse-containing sections.

As described above, in exemplary embodiments, the fuse-receiving plates may be configured to project from the casing surface at a position below the fuse-containing sections. The fuse-receiving plates may substantially contact with the interior of the trim cover under a projecting state. Thus, since the fuse-receiving plates do not project from the opening for maintenance in the trim cover, the sizes of the opening for maintenance and of the fuse-receiving plates do not define design considerations.

Since the fuse-receiving plates, in exemplary embodiments, may be merely provided below the fuse-containing sections and at the position where the fuse that has fallen on the fuse-receiving plate can be taken out through the opening for maintenance, it is possible to define a working space for fuse attachment and detachment between the fuse-containing sections and the fuse-receiving plates. In this manner, the fuse attachment and detachment operations are more easily facilitated.

A projecting amount of each fuse-receiving plate may be small in embodiments where the trim cover is disposed near the electrical junction box. In these embodiments, the fuse-receiving plate should be long enough to contact with the trim cover or to be spaced away from the trim cover by a clearance through which the fuse cannot pass. That is, the length may be set to prevent the fuse from falling down in a position where the fuse is hardly taken out by the surrounding trim cover.

Thus, since the fuse-receiving plates are provided in the electrical junction box in embodiments according to this disclosure, it is possible to prevent the small fuse from falling down in the vehicle body and becoming unretrievable if the small fuse falls down and is lost due to an error occurring during maintenance for exchange of the fuses. In this way, the structure of the disclosed junction box may help to prevent the lost fuse from generating unusual noises when the motor vehicle is driving.

Also, the fuse-receiving plates are provided between the connector-containing sections. Consequently, the fuse-receiving plates can guide wire harnesses connected to the connectors coupled to the connector-containing sections so that the wire harnesses do not interfere with the fuse area. It is possible also to prevent the fuse from falling down into the wires of the wire harnesses.

Preferably, recesses for supporting the fuse-receiving plates are provided at positions below and above the fuse-containing sections on the casing surface. When the casing is mounted on the interior of the motor vehicle in a top-side-down position, an end of the fuse-receiving plate may be press-fitted into and secured to the supporting recess below the fuse-containing sections.

Preferably, peripheral walls project from outer peripheral edges of the fuse-receiving plates.

This configuration can help to prevent the fuse from falling down from the fuse-receiving plates.

Furthermore, it is preferable that the fuse-receiving plates are inclined toward the fuse-containing sections, and/or that reinforcement ribs are provided on the fuse-receiving plates.

This can prevent the fuse-receiving plates from failing in catching the falling fuse due to deformation or inclination of the fuse-receiving plates toward the trim cover by vibrations or impacts when driving the motor vehicle.

BRIEF DESCRIPTION OF THE DRAWINGS

FIG. 1 is a side elevation view of a first embodiment of an electrical junction box according to this disclosure mounted on an interior of a motor vehicle.

FIG. 2 is a perspective view of a casing of the electrical junction box shown in FIG. 1.

FIG. 3 is a perspective view of a casing of the electrical junction box in a second embodiment according to this disclosure.

FIG. 4 is a side elevation view of a third embodiment of the electrical junction box according to this disclosure, illustrating the casing.

FIG. 5 is a schematic side elevation view of a fourth embodiment of the electrical junction box according to this disclosure, illustrating the casing.

FIGS. 6A and 6B are schematic side elevation views of the casing shown in FIG. 5, illustrating the casing disposed in different positions during use.

FIG. 7 is a side elevation view of a prior art electrical junction box.

DETAILED DESCRIPTION OF EMBODIMENTS

In exemplary embodiments, fuse-receiving plates project below the fuse-containing sections in the electrical junction box. This makes it possible to receive a fuse that falls down through an error during maintenance or the like, to prevent the loss of fuse during attachment and detachment operations, and to prevent a lost fuse from generating unusual noises.

In addition, since the fuse-receiving plates do not project through the opening for maintenance in the trim cover, a size of the opening for maintenance is not restricted and flexibility in design is enhanced.

Referring now to the drawings, embodiments of an electrical junction box will be described below.

FIGS. 1 and 2 show a first embodiment of an electrical junction box 10 to be mounted on a motor vehicle.

The electrical junction box 10 is a junction box covered with a trim cover 30 of a motor vehicle. The electrical junction box 10 includes a lower casing 11 and an upper casing 12, but an upper cover is not provided in the box 10.

As shown in FIG. 2, the electrical junction box 10 is provided on a surface of the upper casing 12 with a plurality of connector-containing sections 13 and a plurality of fuse-containing sections 14. As shown in FIG. 1, when the electrical junction box 10 is mounted on the motor vehicle, the upper casing 12 stands on the vehicle in a vertical direction and is disposed inside a trim cover 30 in the vertical direction. Under the mounting position, the fuse-containing sections 14 are opposed to, and spaced away from, an opening 31 for maintenance in the trim cover 30 by a given clearance.

As shown in FIG. 2, a surface of the upper casing 12 is divided into an upper stage area A, an intermediate stage area B, and a lower stage area C. The connector-containing sections 13 are arranged together in the upper stage area A and the lower stage area C while the fuse-containing sections 14 comprising mini-fuse-containing sections 14a and blade-fuse-containing sections 14b are arranged together in the intermediate stage area B.

Fuse-receiving plates 16 and 17 are integrated on the surface of the upper casing 12 to extend horizontally toward the trim cover 30 between the upper stage area A and the intermediate stage area B, and between the intermediate stage area B and the lower stage area C.

The fuse-receiving plates 16 and 17 include longer plate portions 16a and 17a and shorter plate portions 16b and 17b. They are placed next to each other in a width direction of the upper casing 12. The lengths of the longer plate portions 16a, 17a are set so that their distal ends contact with the surface of the trim cover 30, as shown in FIG. 1.

The longer plate portion 17a at a lower position is disposed below the blade-fuse-containing sections 14b while the shorter plate portion 17b is disposed below the mini-fuse-containing sections 14a.

The lengths of the shorter plate portions 16b, 17b are set so that their distal ends are spaced apart from the surface of the trim cover 30 by a given clearance. The clearance is set to keep a working space for a fuse puller when fuses 22 are inserted into, or removed from, the mini-fuse-containing sections 14a most near the shorter plate portion 17b and the clearance is set to prevent the fuses from falling down through the clearance. Accordingly, the fuse-receiving plate below the mini-fuse-receiving sections 14a is set to have the shorter plate portion 17b.

The fuse-receiving plates 16 and 17 may be provided on the opposite end edges in a width direction with peripheral walls 18 extending upward and downward. Additionally, or alternatively, the fuse-receiving plates 16 and 17 may be provided on the top and bottom surfaces with a plurality of reinforcement ribs 19 extending in parallel with the peripheral walls 18 and spaced equally away from one another.

In the electrical junction box 10 described above, as shown in FIG. 1, the fuse-receiving plate 17 below the fuse-containing sections 14 can catch a fuse 22, even if the fuse 22 falls down by an error when the fuse is inserted into, or removed from, the fuse-containing sections 14 during maintenance or the like. Consequently, it is possible to prevent the loss of fuses and save time and effort for finding the loose fuse. In addition, it is possible to prevent the unusual noises due to the fuse that has fallen down inside the trim Cover from occurring.

Since the peripheral walls 18 are provided on the opposite sides of the fuse-receiving plates 16, 17 in the width direction, when the fuse falls down on the plates, the loose fuse can be prevented from further falling down through a lateral gap, thereby preventing the loss of the fuse. Since the reinforcement ribs 19 are provided on the fuse-receiving plates 16, 17, it is possible to prevent the plates from being deformed or inclined.

Since the fuse-receiving plates 16, 17 are provided on boundary parts between the intermediate stage area B having the fuse-containing sections 14 and the upper stage area A and the lower stage area C having the connector-receiving sections 13, as shown in FIG. 1, the fuse-receiving plates 16, 17 can prevent wire harnesses W/H, which are connected to connectors 21 coupled to the connector-containing sections 13, from interfering with the fuses 22 accommodated in the intermediate stage area B. Furthermore, it is possible to prevent the loose fuse from entering the wires in the wire harnesses.

Furthermore, since the fuse-receiving plates 16, 17 are provided on both of the upper and lower positions of the intermediate stage area B having the fuse-containing sections 14, even if the electrical junction box 10 is disposed in the top-side-down position on the motor vehicle, either of the fuse-receiving plates 16 and 17 is always disposed below the fuse-containing sections 14 and the plate can catch the loose fuse.

In addition, since the fuse-receiving plates 16, 17 do not project outward from the opening 31 for maintenance in the trim cover 30, sizes of the fuse-receiving plates 16, 17 are not restricted by sizes of the opening 31 for maintenance.

FIG. 3 shows a second embodiment of the electrical junction box 10.

In the second embodiment, the shorter plate portions 16b and 17b and the longer plate portions 16a and 17a of the fuse-receiving plates 16 and 17 are provided on their distal ends with peripheral walls 20 extending upward and downward. The peripheral walls 20 can prevent the fuse, which has fallen down by an error on the fuse-receiving plates 16, 17, from further falling down into an interior of the motor vehicle through a gap between the fuse-receiving plates 16, 17 and the trim cover 30, thereby preventing the loss of the fuse.

In particular, since there is a clearance between the distal ends of the shorter plate portions 16b, 17b and the trim cover 30, it is preferable to provide the peripheral walls 20 on the shorter plate portions 16b, 17b. In the case where distal ends of the longer plate portions 16a, 17a contact with the trim cover 30, it is not necessary to provide the peripheral walls on the longer plate portions 16a, 17a. However, since any clearance may be formed under a special condition of a vehicle body, it will be preferable to provide the peripheral wall 20 on the distal ends of the longer plate portions 16a, 17a.

FIG. 4 shows a third embodiment of the electrical junction box 10.

In the third embodiment, the fuse-receiving plates 16, 17 are inclined toward the fuse-containing sections 14. Gaps S through which any fuse cannot pass are defined between the projecting distal ends of the longer plate portions 16a, 17a of the fuse-receiving plates 16, 17 and the trim cover 30.

In the third embodiment, when the fuse 22 falls down on, in particular, the shorter plate portions 16b, 17b, since the fuse 22 inclines its center of gravity toward the upper casing 12, the fuse can be prevented from falling down toward the trim cover 30 due to rolling or sliding motion.

FIGS. 5 and 6 show a fourth embodiment of the electrical junction box 10.

In the fourth embodiment, the fuse-receiving plate 16 is detachably provided on the upper casing 12.

In more detail, the upper casing 12 is provided between the upper stage area A and the intermediate stage area B and between the intermediate stage area B and the lower stage area C on the surface with lateral extending recesses 25, 26 for supporting the fuse-receiving plate. Usually, as shown in FIG. 6A, an end of the fuse-receiving plate 16 is press-fitted into and secured to the recess 26 provided between the intermediate stage area B having the fuse-containing sections 14 and the lower stage area C.

In the case where the electrical junction box 10 is disposed in the top-side-down position in the vehicle, as shown in FIG. 6B, the end of the fuse-receiving plate 16 is press-fitted into and secured to the recess 25 disposed in a lower position below the fuse-containing sections 14.

Thus, since the fuse-receiving plate 16 is detachably connected to the upper casing 12, it is possible to always dispose the fuse-receiving plate 16 in the position below the fuse-containing sections 14 by changing an attaching position of a single fuse-receiving plate 16 in accordance with an orientation of the electrical junction box 10, thereby lowering a cost in material.

The above exemplary embodiments are intended to be illustrative and in no way limiting to the subject matter of the pending claims. Various modifications to the above exemplary embodiments are contemplated.

What is claimed is:

1. An electrical junction box to be mounted on a motor vehicle, comprising:
    a casing;
    a trim cover provided with an opening for maintenance in the motor vehicle that covers the casing;
    fuse-containing sections formed on a surface of the casing, such that when the casing is mounted on a motor vehicle, the fuse-containing sections are in a vertical orientation, and opposed to the trim cover; and
    at least one fuse-receiving plate that projects toward the trim cover integrally on or detachably from the surface at a position below the fuse-containing sections, the at least one fuse-receiving plate being of a length that a distal end of the at least one fuse-receiving plate one of contacts the trim cover or is spaced away from the trim cover by a given clearance through which a fuse cannot pass, wherein the at least one fuse-receiving plate is configured to receive a fuse that falls down during a fuse attachment or detachment operation into or out of the fuse-containing sections.

2. The electrical junction box according to claim 1, wherein the at least one fuse-receiving plate is positioned between the fuse-containing sections and connector containing sections.

3. The electrical junction box according to claim 1, wherein recesses for supporting the at least one fuse-receiving plate are provided at a position below and above the fuse-containing sections on said surface, and wherein when the casing is mounted on the interior of the motor vehicle, an end of the at least one fuse-receiving plate is press-fitted into and secured to the recess positioned at least below the fuse-containing sections.

4. An electrical junction box according to claim 1, wherein peripheral walls project from outer peripheral edges of the at least one fuse-receiving plate.

5. An electrical junction box according to claim 1, wherein the at least one fuse-receiving plate is inclined toward the fuse-containing sections.

6. An electrical junction box according to claim 1, wherein reinforcement ribs are provided on the at least one fuse-receiving plate.

* * * * *